United States Patent
Cogan et al.

[11] Patent Number: 6,153,948
[45] Date of Patent: Nov. 28, 2000

[54] ELECTRONIC CIRCUITS WITH WIDE DYNAMIC RANGE OF ON/OFF DELAY TIME

[76] Inventors: Adrian I. Cogan, P.O. Box 522, San Carlos, Calif. 94065; Shukri J. Souri, 919 Mowry Ave. #41, Fremont, Calif. 94536

[21] Appl. No.: 09/133,334

[22] Filed: Aug. 13, 1998

[51] Int. Cl.$^7$ ..................................................... H02J 3/00
[52] U.S. Cl. ............................................................. 307/117
[58] Field of Search ........................... 327/513; 307/117, 307/116, 41; 361/195, 196, 106, 103, 58

[56] References Cited

U.S. PATENT DOCUMENTS

| | | | |
|---|---|---|---|
| 3,737,732 | 6/1973 | Suemasa et al. | 317/141 |
| 4,001,610 | 1/1977 | Griffin | 307/293 |
| 4,035,669 | 7/1977 | Yokoyama | 307/293 |
| 4,160,192 | 7/1979 | McAllise | 315/194 |
| 4,686,383 | 8/1987 | Croft | 307/200 |
| 4,686,386 | 8/1987 | Tadao | 307/269 |
| 4,777,379 | 10/1988 | Young | 307/41 |
| 4,801,822 | 1/1989 | Idaka et al. | 307/311 |
| 5,187,632 | 2/1993 | Biessing | 361/103 |

FOREIGN PATENT DOCUMENTS 2 342 571 9/1977 France .
2 040 121 8/1980 United Kingdom .

OTHER PUBLICATIONS

International Search Report for International Application No. PCT/US99/17719 dated Nov. 19, 1999.

*Primary Examiner*—Josie Ballato
*Assistant Examiner*—Robert L. DeBeradinis

[57] ABSTRACT

The present invention provides an electronic circuit with adjustable delay time for turning on or off an application device or an electronic load. The electronic circuit according to the present invention comprises a switch element for controlling power supplied to a load; and an activation element, coupled to the switch element, for activating the switch element to control power supplied to the load. The activation element includes a sensor for sensing whether there is a change in condition and for delaying activation by the activation element of the switch element upon sensing a change in condition. In one embodiment of the invention, the sensor includes a positive temperature coefficient (PTC) element; the switch element includes a metal-oxide-semiconductor field effect transistor (MOSFET); and the activation element further includes a capacitor and a switch. A change in condition includes an overload and an increase in the ambient temperature.

21 Claims, 4 Drawing Sheets

ELECTRONIC CIRCUITS WITH WIDE DYNAMIC RANGE OF ON/OFF DELAY TIME

BACKGROUND OF THE INVENTION

The present invention relates generally to electronic circuits, and more particularly to electronic circuits with adjustable delay time for turning on or off an application device or an electronic load. Such circuits may be used in overload protection applications.

In a typical overload protection circuit, a resettable fuse, e.g., a positive temperature coefficient (PTC) device, is used. When there is a change in condition, such as occurrence of an overload, the PTC device trips and becomes a very large resistance, thus limiting the current flow and providing overload protection. When the new condition disappears, the resistance of PTC device decreases to its normal value, i.e., a low resistance value, and the application circuit resumes its normal operation.

In many instances, it may desirable to provide a delay time in turning off or on an application device or an electronic load. It may further be desirable to provide an adjustable delay, time upon a change in condition, such as occurrence of an overload or overheat. Also, fault conditions may occur when an electric motor is stalled or an electronic load is short circuited by accident. Such a condition change may also be intentionally generated as input signal to provide a longer delay time in turning off or on an application device or an electronic load.

SUMMARY OF THE INVENTION

The present invention provides an electronic circuit with adjustable delay time for turning on or off an application device or an electronic load. The electronic circuit according to the present invention comprises a switch element for controlling power supplied to a load; and an activation element, coupled to the switch element, for activating the switch element to control power supplied to the load. The activation element includes a sensor for sensing whether there is a change in condition and for delaying activation by the activation element of the switch element upon sensing a change in condition.

In one embodiment of the invention, the sensor includes a positive temperature coefficient (PTC) element; the switch element includes a metal-oxide-semiconductor field effect transistor (MOSFET); and the activation element further includes a capacitor and a switch. A change in condition includes an overload and an increase in the ambient temperature.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DETAILED DESCRIPTION OF THE PREFERRED EMBODIMENTS

Figure 1A:
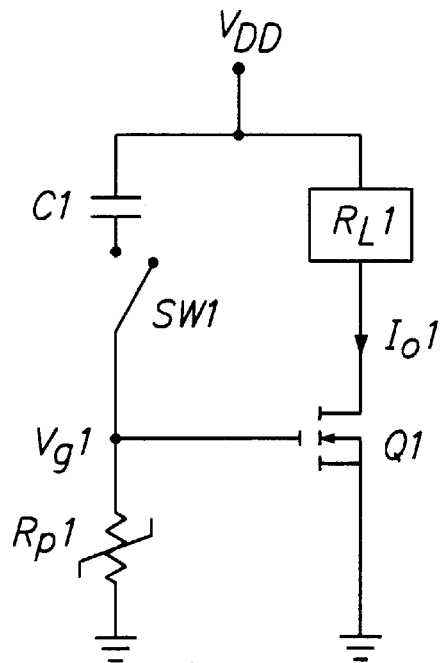
FIG. 1A shows a first embodiment according to the present invention.
Figure 1B:
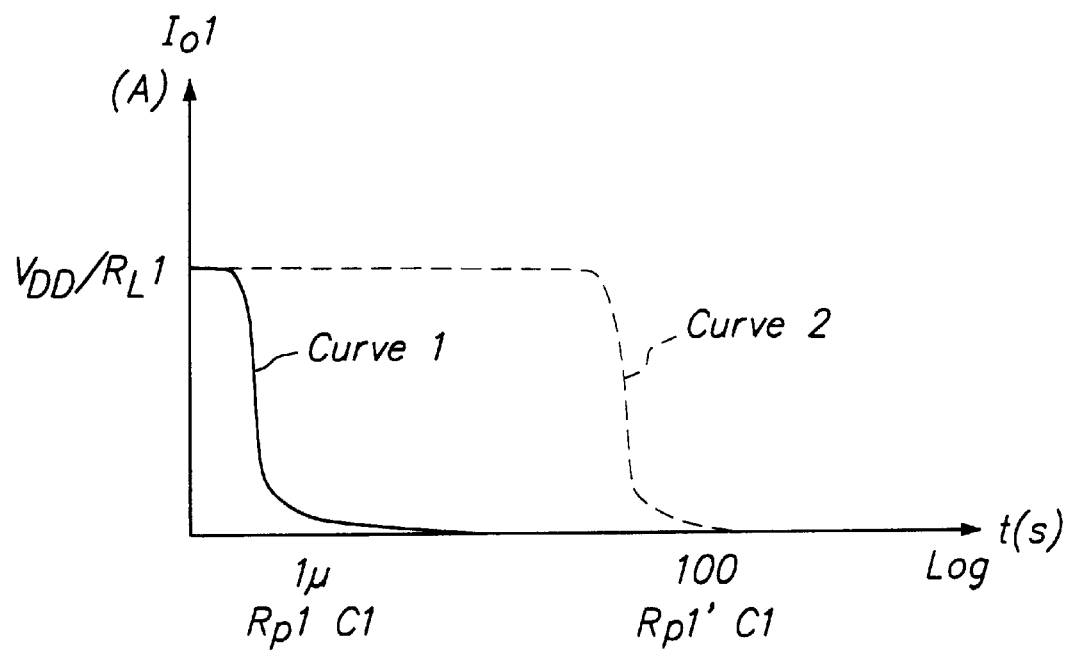
FIG. 1B shows two curves illustrating the operation of the first embodiment under different conditions.

FIG. 1A shows a first embodiment according to the present invention. FIG. 1B shows two curves illustrating the operation of the first embodiment under different conditions. As shown in FIG. 1A, a capacitor C1 is coupled to a voltage source VDD and is also to be coupled to a positive coefficient temperature (PTC) device Rp1 via a switch SW1. Rp1 is coupled to a gate electrode of an n-channel enhancement type, MOSFET Q1. A load RL1 is coupled between voltage source VDD and a drain electrode of transistor Q1. Transistor Q1 has its source electrode coupled to the ground.

In this embodiment, when power is applied (i.e., when SW1 is closed), transistor Q1 is turned on and then turned off after a predetermined on-duration. If there is a change in condition, such as occurrence of an overload or overheat, which is thermally sensed by Rp1, the on-duration will be longer, i.e., the turn-off time will be later than under the normal condition, as will be described below in detail.

At time t=0, SW1 is closed and current flows through C1, which behaves as a short circuit initially. Thus, the gate voltage Vg1 is equal to VDD, which turns on transistor Q1, causing the output current Io1 flowing through load RL1 at a maximum level of VDD/RL1. In other words, when switch SW1 is initially closed, load RL1 will be operated at the full power until after the time t=Rp1•C1, the RC constant, as illustrated by curve 1 in FIG. 1B.

As capacitor C1 is been charging up gradually, the gate voltage Vg1 is decreasing, causing the current Io1 to gradually decrease. Eventually, after a time period of Rp1•C1, when capacitor C1 is fully charged, Vg1 becomes equal to the ground level, causing transistor Q1 to turn off. As a result, no current flows in load RL1, i.e., the output current Io1 is zero.

If, however, at t=0 when switch SW1 is closed, there is an occurrence of an overload or overheat sensed by Rp1 as it may be caused by the ambient temperature for instance, the PTC device will become a large resistance Rp1'. In such case, it takes a longer time period of about: Rp1'•C1 to fully charge capacitor C1 and load RL1 will be initially operated at the full power until after the time t=Rp1'•C1, as illustrated by curve 2 in FIG. 1B. Thus, there is a time delay in turning off transistor Q1, from Rp1•C1 to Rp1'•C1.

As an example, if Rp1 is a polymeric PTC resistor, such as PolySwitch® device manufactured by Raychem Corporation, Menlo Park, Calif., its resistance value may change from, for instance, 1 ohm at 25° C. to 100M ohms at 150° C., an 8 order of magnitude change. Also, if C1 is equal to 1 $\mu$F, the time constant t=Rp1•C1 will change from 1 $\mu$s to 100 s, an extremely wide dynamic range. Other types of PTC device may also be used.

Figure 2A:
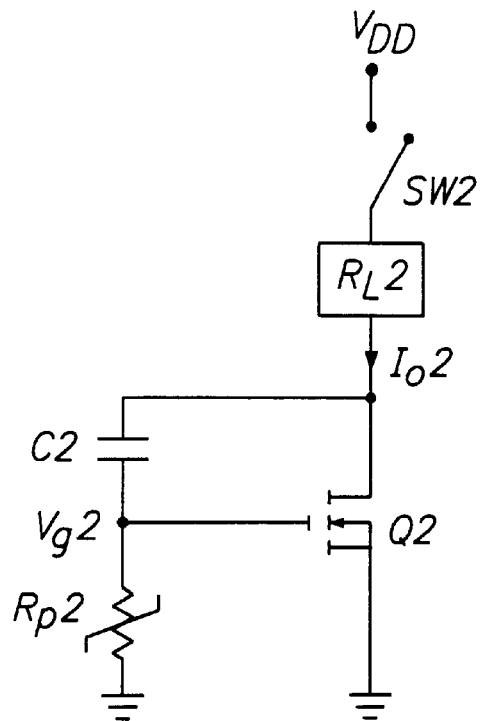
FIG. 2A shows a second embodiment according to the present invention.
Figure 2B:
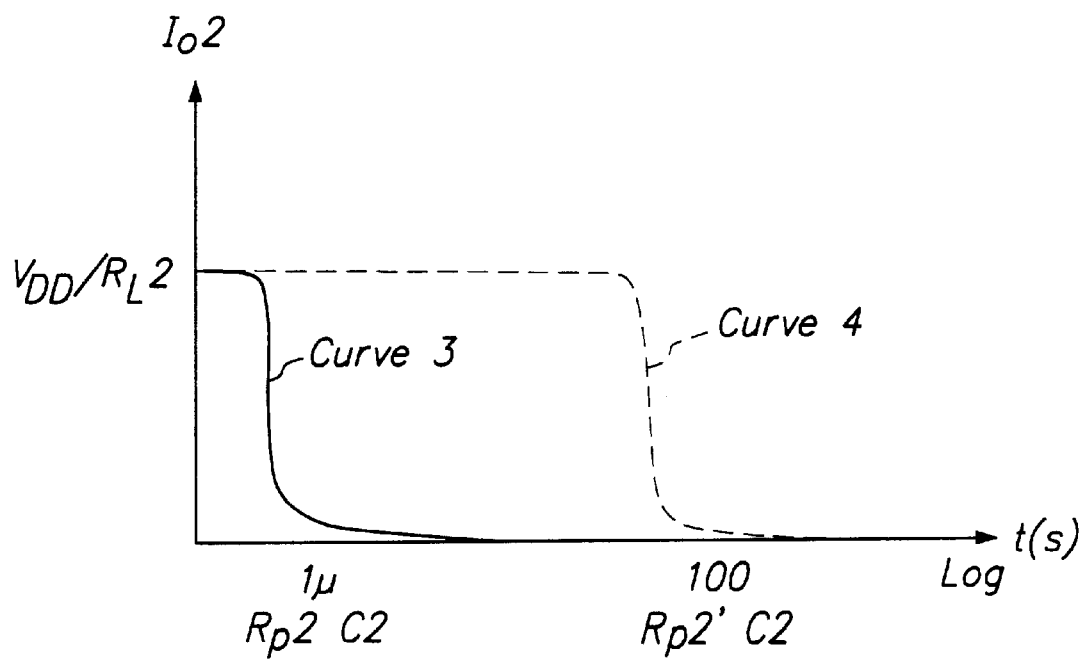
FIG. 2B shows two curves illustrating the operation of the second embodiment under different conditions.

FIG. 2A shows a second embodiment according to the present invention. This second embodiment is a variation of the first embodiment in FIG. 1A. Its operation is similarly illustrated by the two curves in FIG. 2B. As shown in FIG. 2, a load RL2 has one end coupled to a switch SW2 and the other end coupled to a drain electrode of an n-channel enhancement type, MOSFET Q2. Switch SW2 is coupled to voltage source VDD. A capacitor C2 is coupled between the drain and gate electrodes of transistor Q2. A PTC device Rp2 is coupled between the gate electrode of transistor Q2 and the ground. Transistor Q2 has its source electrode coupled to the ground.

At time t=0, SW2 is closed and current flows through C2, which behaves as a short circuit initially. Thus, the gate voltage Vg2 is equal to VDD, which turns on transistor Q2, causing the output current Io2 flowing through load RL2 at a maximum level of VDD/RL2, as illustrated by curve 3 in FIG. 2B. As capacitor C2 charges up gradually, the gate voltage Vg2 decreases, causing the current Io2 to gradually decrease. Eventually, after a time period of Rp2•C2, when capacitor C2 is fully charged, Vg2 becomes equal to the ground level, causing transistor Q2 to turn off. As a result, no current flows in load RL2, i.e., the output current Io2 is zero.

If, at t=0 when switch SW2 is closed, there is an occurrence of an overload or overheat as it may be caused by the ambient temperature, the PTC device will trip and become a large resistance Rp2'. In such case, it takes a time period of about Rp2'•C2 to fully charge capacitor C2 and load RL1 will be initially operated at the full power until after the time t=Rp2'•C2, as illustrated by curve 4 in FIG. 2B. Thus, there is a time delay in turning off transistor Q2, from Rp2•C2 to Rp2'•C2.

As an example, if Rp2 is a polymeric PTC resistor, such as PolySwitch® device manufactured by Raychem Corporation, Menlo Park, Calif., its resistance value may change from, for instance, 1 ohm at 25° C. to 100M ohms at 150° C., an 8 order of magnitude change. Also, if C2 is equal to 1 $\mu$F, the time constant t=Rp2•C2 will change from 1 $\mu$s to 100 s, an extremely wide dynamic range. Other types of PTC device may also be used.

Figure 3A:
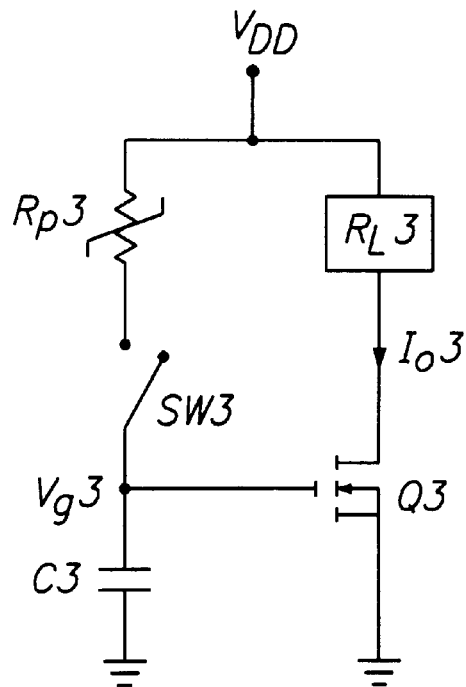
FIG. 3A shows a third embodiment according to the present invention.
Figure 3B:
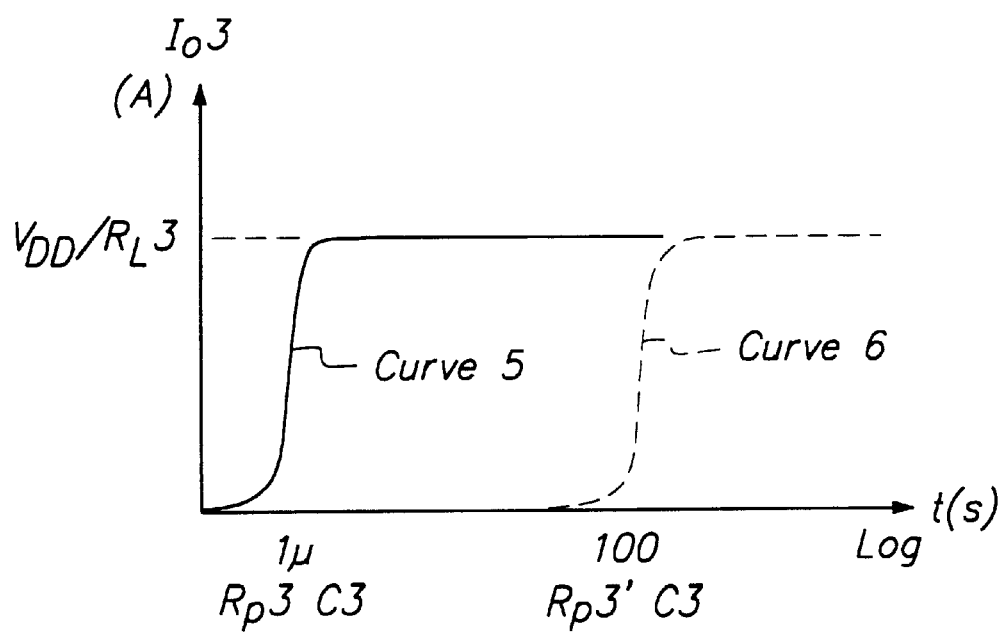
FIG. 3B shows two curves illustrating the operation of the third embodiment under different conditions.

FIG. 3A shows a third embodiment according to the present invention. FIG. 3B shows two curves illustrating the operation of the third embodiment under different conditions. As shown in FIG. 3A, a PTC device Rp3 is coupled between voltage source VDD and a switch SW3, which is coupled to a gate electrode of an n-channel, enhancement type MOSFET Q3. A capacitor C3 is coupled between the gate electrode of the transistor Q3 and the ground. A load RL3 is coupled between voltage source VDD and a drain electrode of transistor Q3. A source electrode of transistor Q3 is coupled to the ground.

In the third embodiment, when power is applied (i.e., SW3 is closed), transistor Q3 is turned off and then turned on after a predetermined off-duration. If there is a change in condition, such as occurrence of an overload or overheat, the off-duration will be longer, i.e., the turn-on time will be later than under the normal condition, as will be described below in detail.

At time t=0, SW3 is closed and current flows through Rp3 and C3, which behaves as a short circuit initially. Thus, the gate voltage Vg3=0, which keeps transistor Q3 off. Therefore, no current flows in load RL3 and the output current Io3 is zero, until after the time t=Rp3•C3, the RC constant, as illustrated by curve 5 in FIG. 3B.

As capacitor C3 charges up gradually, the gate voltage Vg3 increases, causing the current Io3 to gradually increase. Eventually, after a time period of Rp3•C3, when capacitor C3 is; fully charged, Vg3 becomes equal to VDD. As a result, the output current flowing in load RL3 is at a maximum level of VDD/RL3, as illustrated by curve 5 in FIG. 3B.

If, however, at t=0 when switch SW3 is closed, there is an occurrence of an overload or overheat as it may be caused by the ambient or load temperature values, the PTC device resistance will increase and become a larger resistance Rp3'. In such case, it takes a time period of about Rp3'•C3 to fully charge capacitor C3 and load RL3 will be operated at the full power only after the time t=Rp3'•C3, as illustrated by curve 6 in FIG. 3B. Thus, there is a time delay in turning on transistor Q3, from Rp3•C3 to Rp3'•C3.

As an example, if Rp3 is a polymeric PTC resistor, such as PolySwitch® device manufactured by Raychem Corporation, Menlo Park, Calif., its resistance value may change from, for instance, 1 ohm at 25° C. to 100M ohms at 150° C., an 8 order of magnitude change. Also, if C3 is equal to 1 $\mu$F, the time constant t=Rp3•C3 will change from 1 $\mu$s to 100 s, an extremely wide dynamic range. Other types of PTC device may also be used.

Figure 4A:
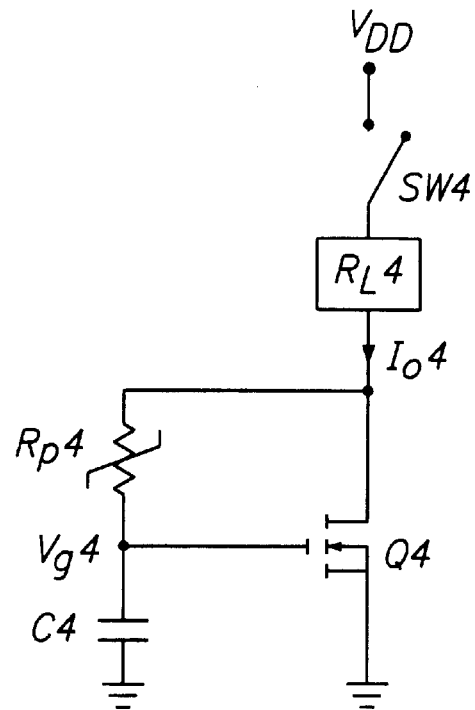
FIG. 4A shows a fourth embodiment according to the present invention.
Figure 4B:
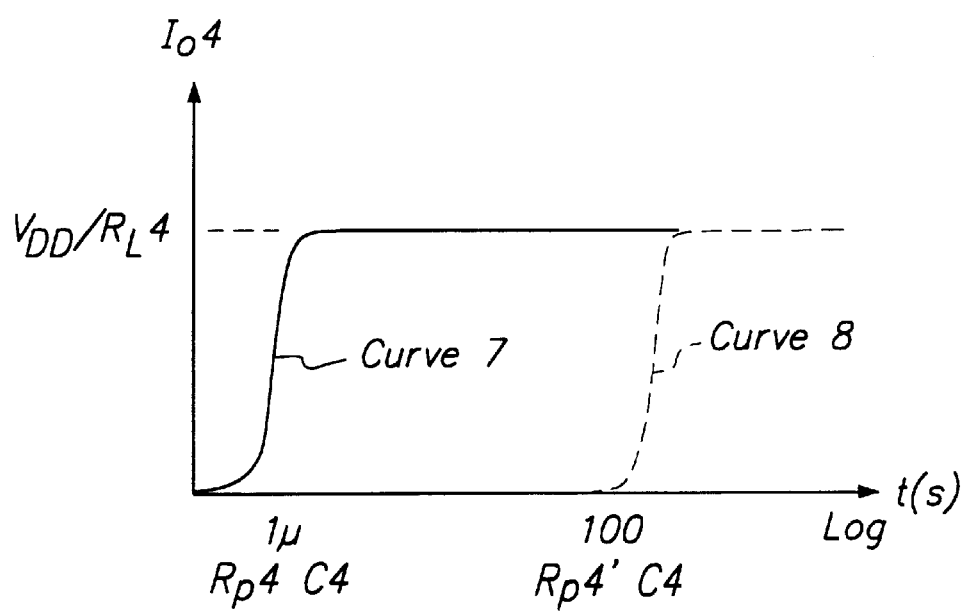
FIG. 4B shows two curves illustrating the operation of the fourth embodiment under different conditions.

FIG. 4A shows a fourth embodiment according to the present invention. This embodiment is a variation of the third embodiment in FIG. 3A. Its operation is similarly illustrated by the two curves in FIG. 4B. As shown in FIG. 4, a load RL4 is coupled between a switch SW4 and a drain electrode of an n-channel enhancement type, MOSFET Q4. Switch SW4 is coupled to voltage source VDD. A PTC device Rp4 is coupled between a load RL4 and a gate electrode of transistor Q4. A capacitor C4 is coupled between the drain and gate electrodes of transistor Q4. The source electrode of transistor Q4 is coupled to the ground.

At time t=0, SW4 is closed and current flows through Rp4 and C4, which behaves as a short circuit initially. Thus, the gate voltage Vg4 is equal to the ground, which turns off transistor Q4. Therefore, no current flows in load RL4 and the output current Io4 is zero, as illustrated by curve 7 in FIG. 4B. As capacitor C4 charges up gradually, the gate voltage Vg4 increases, causing the current Io4 to gradually increase. Eventually, after a time period of Rp4•C4, when capacitor C4 is fully charged, Vg4 becomes equal to VDD. As a result, the current flowing in load RL4, i.e., Io4 is at a maximum level of VDD/RL4, as illustrated by curve 8 in FIG. 4B.

If, at t=0 when switch SW4 is closed, there is an occurrence of an overload or overheat as it may be caused by the ambient or load temperature, the PTC device will trip and become a large resistance Rp4'. In such case, it takes a time period of about Rp4'•C4 to fully charge capacitor C4 and load RL4 will be operated at the full power after the time t=Rp4'•C4, as illustrated by curve 8 in FIG. 4B. Thus, there is a time delay in turning on transistor Q4, from Rp4•C4 to Rp4'•C4.

As an example, if Rp4 is a polymeric PTC resistor, such as PolySwitch® device manufactured by Raychem Corporation, Menlo Park, Calif., its resistance value may change from, for instance, 1 ohm at 25° C. to 100M ohms at 150° C., an 8 order of magnitude change. Also, if C4 is equal to 1 $\mu$F, the time constant t=Rp4•C4 will change from 1 $\mu$s to 100 s, an extremely wide dynamic range. Other types of PTC device may also be used.

In the above four embodiments, the operations have been described in connection with an situation in which the PTC devices were initially in a normal condition and later becomes a large resistance. If the PTC device is initially overheated with a large resistance value and later cools down, the curves illustrated will change in the reverse direction. For instance, in the first embodiment, when the PTC device Rp1 changes from a hot condition to a cold condition, the operation curves change from curve 2 to curve 1.

While the invention has been described in conjunction with several specific embodiments, it is evident to those skilled in the art that many further alternatives, modifications, applications and variations will be apparent in light of the foregoing description. For example, a resistor may also be connected in series with the PTC device in the first and second embodiments for adjusting the on-duration ranges of the transistors. Also, a negative temperature coefficient (NTC) device may be used in place of the PTC device with appropriate changes in the polarities. Thus, the invention described herein is intended to embrace all such alternatives, modifications, applications and variations as may fall within the spirit and scope of the appended claims.

What is claimed is:

1. An electronic circuit, comprising:
    a switch element for controlling power supplied to a load, the switch element including a metal-oxide-semiconductor field effect transistor (MOSFET);
        wherein the MOSFET is of enhancement type and includes a drain electrode, a gate electrode and a source electrode, with the source electrode being coupled to a ground level; and,
        wherein the load is to be coupled between a power source and the drain electrode of the MOSFET; and,
    an activation element, coupled to said switch element, for activating said switch element to control power supplied to the load, said activation element including a sensor for sensing whether there is a change in condition and for delaying activation by said activation element of said switch element upon sensing a change in condition, said activation element further including a capacitor and a switch;
        wherein the capacitor is coupled between the power source and the switch of said activation element;
        wherein the switch of said activation element is coupled between the capacitor and the gate electrode of the MOSFET; and,
        wherein said sensor is coupled between the gate electrode of said switch element and the ground level.

2. The circuit of claim 1, wherein said sensor includes a positive temperature coefficient (PTC) element.

3. The circuit of claim 1 wherein the change in condition includes an overload.

4. The circuit of claim 1 wherein the change in condition includes an increase in ambient temperature.

5. An electronic circuit, comprising:
    a switch element for controlling power supplied to a load, the switch element including a metal-oxide-semiconductor field effect transistor (MOSFET);
        wherein the MOSFET is of enhancement type and includes a drain electrode, a gate electrode and a source electrode, with the source electrode being coupled to a ground level; and,
    an activation element, coupled to said switch element, for activating said switch element to control power supplied to the load, said activation element including a sensor for sensing whether there is a change in condition and for delaying activation by said activation element of said switch element upon sensing a change in condition, said activation element further including a capacitor and a switch;
        wherein the switch of said activation element has first and second ends, with the first end being coupled to a power source;
        wherein the load is coupled between the second end of the switch of said activation element and the drain electrode of the MOSFET;
        wherein the capacitor is coupled between the drain and gate electrodes of said switch element; and
        wherein said sensor is coupled between the gate electrode of said switch element and the ground level.

6. The circuit of claim 5, wherein said sensor includes a positive temperature coefficient (PTC) element.

7. The circuit of claim 5 wherein the change in condition includes an overload.

8. The circuit of claim 5 wherein the change in condition includes an increase in ambient temperature.

9. An electronic circuit, comprising:
    a switch element for controlling power supplied to a load, the switch element including a metal-oxide-semiconductor field effect transistor (MOSFET);
        wherein the MOSFET is of enhancement type and includes a drain electrode, a gate electrode and a source electrode, with the source electrode being coupled to a ground level; and,
        wherein the load is to be coupled between a power source and the drain electrode of the MOSFET; and,
    an activation element, coupled to said switch element, for activating said switch element to control power supplied to the load, said activation element including a sensor for sensing whether there is a change in condition and for delaying activation by said activation element of said switch element upon sensing a change in condition, said activation element further including a capacitor and a switch;
        wherein the capacitor is coupled between the gate electrode of the MOSFET and ground level;
        wherein the switch of said activation element is coupled between said sensor and the gate electrode of the MOSFET; and
        wherein said sensor is coupled between the power source and the switch of said activation element.

10. The circuit of claim 9, wherein said sensor includes a positive temperature coefficient (PTC) element.

11. The circuit of claim 9 wherein the change in condition includes an overload.

12. The circuit of claim 9 wherein the change in condition includes an increase in ambient temperature.

13. An electronic circuit, comprising:
    a switch element for controlling power supplied to a load, the switch element including a metal-oxide-semiconductor field effect transistor (MOSFET);
        wherein the MOSFET is of enhancement type and includes a drain electrode, a gate electrode and a source electrode, with the source electrode being coupled to a ground level; and
    an activation element, coupled to said switch element, for activating said switch element to control power supplied to the load, said activation element including a sensor for sensing whether there is a change in condition and for delaying activation by said activation element of said switch element upon sensing a change in condition, said activation element further including a capacitor and a switch;
        wherein the switch of said activation element has first and second ends, with the first end being coupled to a power source;
        wherein the load is to be coupled between the second end of the switch of said activation element and the drain electrode of the MOSFET;
        wherein the capacitor is coupled between the gate electrode of said switch element and ground level; and, wherein said sensor is coupled between the drain and gate electrodes of the MOSFET.

14. The circuit of claim 13, wherein said sensor includes a positive temperature coefficient (PTC) element.

15. The circuit of claim 13 wherein the change in condition includes an overload.

16. The circuit of claim 13 wherein the change in condition includes an increase in ambient temperature.

17. An electronic circuit having a wide dynamic range of on/off delay time comprising:

a metal-oxide-semiconductor field effect transistor (MOSFET) having source and drain electrodes in series between a load and a power supply, and having an insulated gate control electrode, a resistance-capacitance series network having a common node directly connected to the insulated gate control electrode and being in series with a switch for applying a control voltage to the network, the network including a capacitor and a resistor comprising a variable temperature coefficient device having a positive temperature-resistance wide dynamic range, such that at a nominal ambient temperature of the device a gate voltage at the common node switches a conductive state of the MOSFET at a first time interval following activation of the switch, and that at an elevated ambient temperature equaling at least a trip temperature of the device the gate voltage at the common node switches the conductive state of the MOSFET at a second time interval following activation of the switch, the second time interval being much longer than the first time interval.

18. The electronic circuit set forth in claim 17 wherein the device comprises a polymeric positive temperature coefficient resistor having a wide dynamic range of resistance on the order of eight orders of magnitude between a low resistance at nominal ambient temperature and a high resistance at and above trip temperature.

19. The electronic circuit set forth in claim 17 wherein the capacitor is in series with the switch and the control voltage, and the resistor is in series with the capacitor and a return path of the control voltage, such that said conductive state of the MOSFET is changed from on to off.

20. The electronic circuit set forth in claim 17 wherein the resistor is in series with the switch and the control voltage, and the capacitor is in series with the resistor and a return path to the control voltage, such that said conductive state of the MOSFET is changed from off to on.

21. The electronic circuit set forth in claim 17 wherein said control voltage is taken directly from said power supply.

* * * * *